United States Patent [19]

Chaki

[11] Patent Number: 4,528,859
[45] Date of Patent: Jul. 16, 1985

[54] POINTER SLIDING MECHANISM FOR USE IN PUSHBUTTON TUNER

[75] Inventor: Takao Chaki, Tokyo, Japan

[73] Assignee: Clarion Co., Ltd., Tokyo, Japan

[21] Appl. No.: 393,256

[22] Filed: Jun. 29, 1982

[30] Foreign Application Priority Data

Jun. 30, 1981 [JP] Japan .............................. 56-96010[U]

[51] Int. Cl.³ ............................. H03J 5/12; H03J 1/02
[52] U.S. Cl. ................................... 74/10.33; 116/259; 116/281; 116/328; 334/7; 334/86
[58] Field of Search .................. 74/10.33, 10.37, 10.9, 74/469; 334/7, 86; 116/241, 281, 259, 321, 328, 261

[56] References Cited

U.S. PATENT DOCUMENTS

| | | | |
|---|---|---|---|
| 2,252,295 | 8/1941 | Plensler | 116/261 |
| 2,494,008 | 1/1950 | Schwarz et al. | 74/10.33 |
| 3,247,728 | 4/1966 | Wolf et al. | 74/10.33 |
| 3,263,516 | 8/1966 | Chisholm | 74/469 |
| 3,463,017 | 8/1969 | Stamm et al. | 74/10.33 |
| 3,646,821 | 3/1972 | Clark | 74/10.33 |
| 3,995,242 | 11/1976 | Chaki | 74/10.33 |
| 4,099,421 | 7/1978 | Ohashi et al. | 74/10.33 |
| 4,189,949 | 2/1980 | Righi et al. | 334/7 |
| 4,204,179 | 5/1980 | Kataoka et al. | 74/10.33 |

FOREIGN PATENT DOCUMENTS

| | | | |
|---|---|---|---|
| 522142 | 3/1955 | Italy | 74/10.33 |
| 10731 | 2/1981 | Japan | 74/10.33 |
| 2088661 | 6/1982 | United Kingdom | 334/7 |

OTHER PUBLICATIONS

Robert's Linkage, Fig. 2, p. 74, Mechanisms, Linkages, and Mechanical Controls, 1965 ©.

*Primary Examiner*—Allan D. Herrmann
*Attorney, Agent, or Firm*—Flynn, Thiel, Boutell & Tanis

[57] ABSTRACT

In a pointer sliding mechanism intended for use in a pushbutton tuner, there is fixed on the base plate of the tuner a pair of pivots, right and left, on which right and left links are pivotably mounted at the front ends thereof; a pointer mount-plate is pivotably mounted to the right and left links at the rear ends thereof so as to couple these links together. On the other hand, there is provided on the base plate of the pushbutton tuner a memory slide which is movable in the direction of the width of the tuner, and a V-shaped link is mounted between the memory slide and one of the links supporting the pointer mount-plate, which V-shaped link is freely openable and closable; the arm of this V-shaped link on the side of the memory slide is pivotably mounted at the central portion thereof to a pivot fixed to the base plate.

9 Claims, 8 Drawing Figures

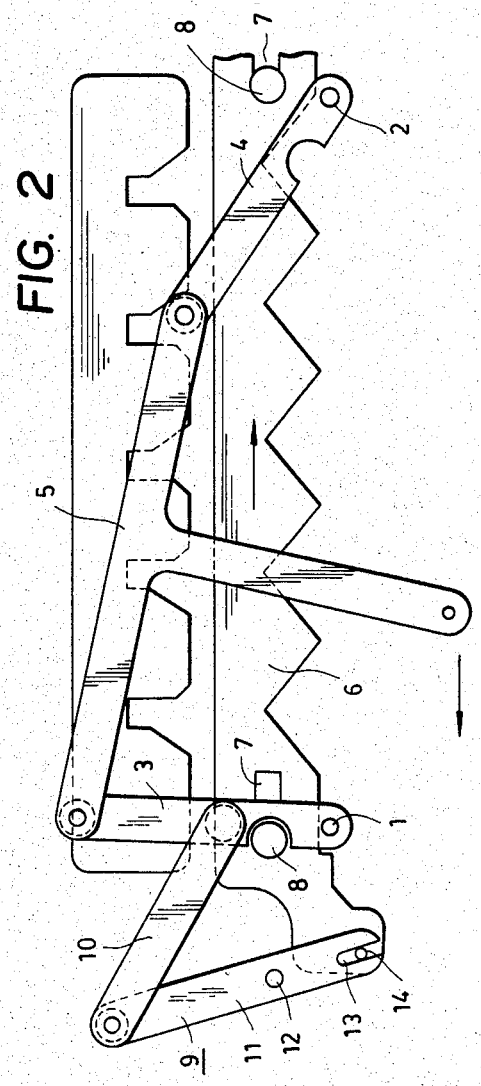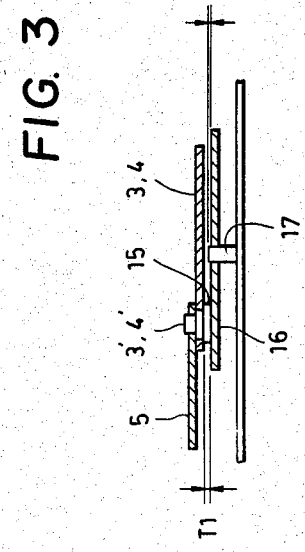

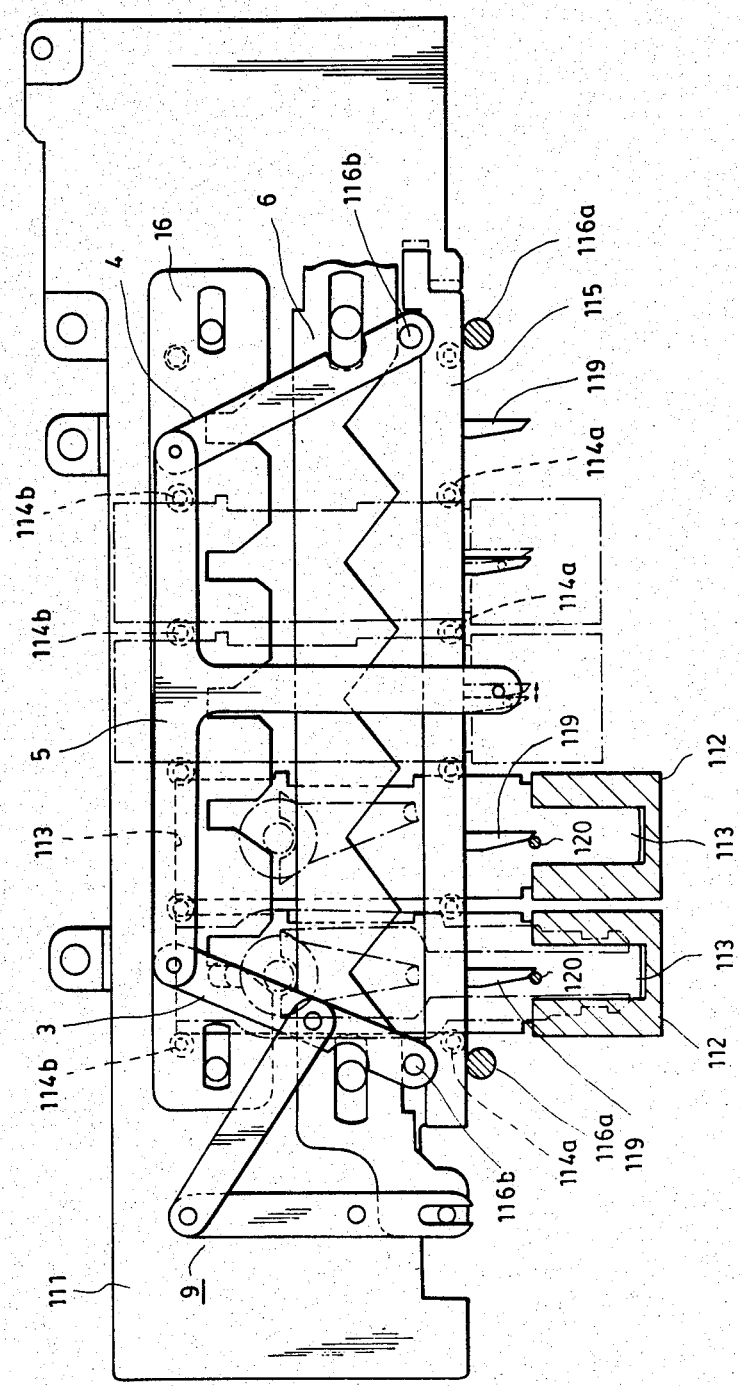

POINTER SLIDING MECHANISM FOR USE IN PUSHBUTTON TUNER

BACKGROUND OF THE INVENTION

1. Field of the Invention

The present invention relates to a pointer sliding mechanism intended to be used in a pushbutton tuner.

2. Description of the Prior Art

With a pushbutton tuner, when the button assigned to a desired frequency is pressed, a tuning core is so moved in and out of a tuning coil as to tune a radio receiver to that frequency; heretofore, the position of the tuning core, that is, the frequency thus selected, was indicated with a position on a scale of a waveband meter to which a pointer has been moved by a memory slide interlocked with the tuning core. In such a pointer sliding mechanism, the turning direction of the tuning knob should preferably be coincident with the sliding direction of the pointer. For example, as the tuning knob is turned clockwise to select a higher frequency, the pointer indicating a frequency should preferably be slid from the left of the memory plate to the right since this arrangement will facilitate the tuning to a desired frequency with a feeling of the coincidence in direction of the turn of the tuning knob with the movement of the pointer. In this case, there will be no problem so long as the memory slide is interlocked in such a manner with the tuning core as to slide in the same direction as the pointer as the tuning knob is turned. In some cases however, it is not possible, due to the positional relation between the memory slide and tuning core and to the design of a link for coupling them together, to make the memory slide coincide in direction of movement with the pointer. In such a case, for the coincidence in direction of the movement, there has been provided between the memory slide and pointer a link for the reversal of the movement of either the memory slide or pointer, which would make the pointer move in the same direction as the tuning knob even in case the memory slide is made to move in a direction opposite to that in which the tuning knob is turned. Nevertheless, any such pointer sliding mechanisms which has been proposed has a complicated design, and the pointer is moved along a path describing an arc; to avoid that the pointer gets in contact with the scale plate or a like member, the space in which the pointer is moved must be sufficiently wide. Thus, it is difficult to provide a compact design of pushbutton tuner.

SUMMARY OF THE INVENTION

Accordingly, the present invention is proposed to overcome the above-mentioned drawbacks of the prior art, and has as an object to provide a pointer sliding mechanism intended to be used in a pushbutton tuner, in which the pointer can be slid along a straight line in a direction opposite to that in which the memory slider is moved.

The above and other advantages and features of the present invention will be better understood from the ensuing description made by way of example of the preferred embodiments according to the present invention in reference to the accompanying drawings.

BRIEF DESCRIPTION OF THE DRAWINGS

The drawings illustrate the preferred embodiments of the pointer sliding mechanism according to the present invention, in which:

FIG. 2 is a similar view showing the pointer moved to the left;

FIG. 3 is a sectional view in a larger scale of the mechanism according to the present invention showing the connection between the pointer mount-plate and link thereof;

FIG. 4 is a plan view of another embodiment according to the present invention illustrating a kick arm support mechanism;

DETAILED DESCRIPTION OF THE PREFERRED EMBODIMENTS

Figure 1:
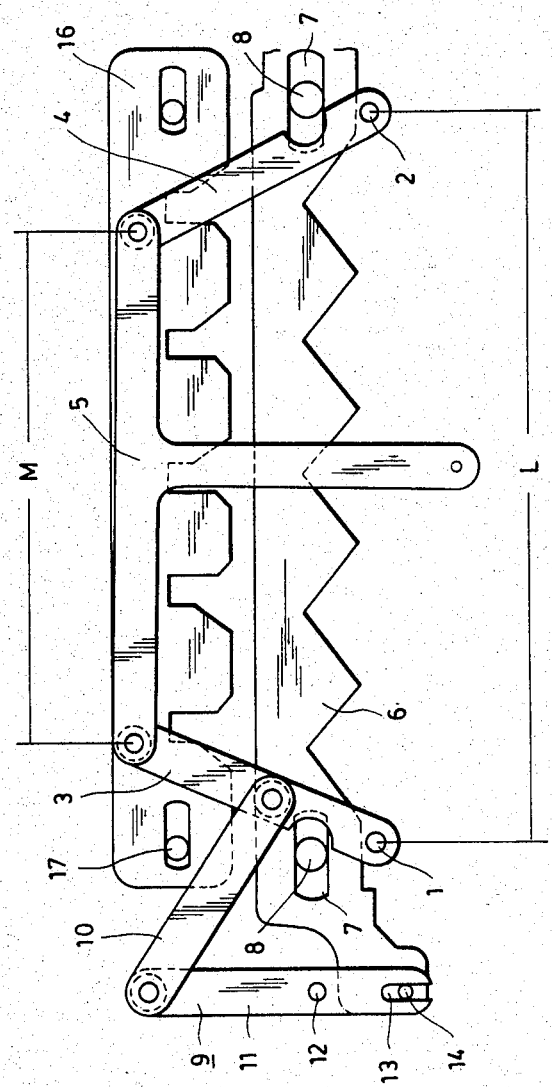
FIG. 1 is a plan view of the mechanism according to the present invention showing the pointer nearly in the center.

Referring now to FIGS. 1 and 2, fixed on the base plate of the pushbutton tuner are a pair of left and right pivots 1 and 2 on which links 3 and 4 are pivotably mounted at the front ends thereof, respectively. The links 3 and 4 mounted on the left and right pivots 1 and 2, respectively, have the same length, and have mounted at the rear ends thereof a generally T-shaped pointer mount-plate 5. That is to say, this pointer mount-plate 5 is pivotably coupled at the opposite ends of the horizontal or cross section of its T shape to the rear ends, respectively, of said links 3 and 4, while the vertical or stem section of the T shape extends in the direction of the front side of the pushbutton tuner. At the front end of the vertical extension of the T shape is mounted a pointer for the pushbutton tuner. The length of the horizontal section of the pointer mount-plate 5 in T shape, namely, the space M between the rear ends of the links 3 and 4, is shorter than the space L between the pivots 1 and 2 which support the links 3 and 4 at the respective front ends thereof.

Below the pointer mount-plate 5 is provided a memory slide 6 in such a manner that it is free to move along the width of the pushbutton tuner; namely, there is fixed on the base plate of the pushbutton tuner a pair of left and right guide pins 7 which are slidably fitted in guide holes 8 formed in the memory slide 6. Thus, the memory slide 6 is moved as guided by the guide pins 7 and guide holes 8. There is mounted between one end (left-hand end in the plane of Figure) of the memory slide 6 and the left link 3 supporting the pointer mount-plate 5 a V-shaped link 9 consisting of a pointer-side arm or link member 10 pivotably coupled with the left link 3 nearly at the center thereof and a memory slide-side arm or link member 11 also pivotably connected with the pointer-side arm 10. The memory slide-side arm 11 is pivotably supported nearly at the center thereof by a pivot 12 fixed to the base plate of the pushbutton tuner, and it has formed in the front end thereof a guide recess or slot 13 extending along the length of the arm 11 and in which is slidably engaged a pin 14 provided on the end of the memory slide 6.

The pointer sliding mechanism according to the present invention has a structure having been described in the foregoing, and functions as follows:

When the memory slide 6 is moved rightward, by way of example, in the plane of Figure as the tuning knob is turned or with the pushbutton pressed, the memory slide-side arm 11 of the V-shaped link 9 is attracted by the pin 14 provided on the end of the memory slide 6 so as to pivot counterclockwise pivot about the 12. Then, the pointer-side arm 10 of the V-shaped link 9, which is coupled with the memory slide-side arm 11, is towed to the left and at the same time, the left link 3 coupled with the pointer-side arm 10 is moved leftward around the pivot 1. Since the left link 3 supports the pointer mount-plate 5 in cooperation with the right link 4, the pointer mount-plate 5 and also the right link 4 are moved as the left link 3 is moved. In this case, the front end of the pointer mount-plate 5 will describe a nearly straight-line orbit because of the movement of the left and right links 3 and 4 about the pivots 1 and 2. When the memory slide 6 is thus moved to the right in the plane of Figure, the pointer mount-plate 5 coupled with the memory slide 6 by means of the V-shaped link 9 is moved leftward, namely, in a direction opposite to that in which the memory slide 6 moves. On the contrary, when the memory slide 6 is moved rightward in the plane of the Figure, the V-shaped link 9 and the left and right links 3 and 4 coupled with the memory slide are moved in the opposite direction so that also the pointer mount-plate 5 is moved rightward in the plane of the Figure.

As having been described in the foregoing, in the pointer sliding mechanism according to the present invention, the left and right links 3 and 4 mounted on the base plate of the pushbutton tuner in order to provide a straight movement of the pointer, and the memory slide also movable over the base plate, are coupled by means of the V-shaped link which reverses the moving direction of the memory slide 6 and transmits the movement to the pointer. According to the present invention, even if the tuning knob is turned in a direction opposite to that in which the memory slide 6 operationally coupled with the knob is moved, it is possible to assure a coincidence in direction between the turning of the movement of the pointer and the turning of the tuning knob. As the result, the pointer may be slid in any direction by turning the tuning knob with no feeling of anything unnatural, thus tuning can be smoothly done. Further, because of the provision of the V-shaped link 9, it is unnecessary to make the moving direction of the memory slide 6 coincide with that of the pointer; thus, a free choice of the arrangement of the memory slide 6 as well as the tuning core and knob coupled with the memory slide, and of the coupling means for them, are assured. It is possible to design a compact tuner and to reduce the necessary number of its parts.

It should be noted that below pins 3' and 4' which are provided in the connection between the pointer mount-plate 5 and left and right links 3 and 4, may be provided a seat 15 as shown in FIG. 3. The lower side of the seat 15 slidably touches the upper side of the memory slide 6 or of a change plate 16 to support the pointer mount-plate 5 and links 3 and 4 so as not to be in contact with the memory slide 6 and change plate 16. That is to say, the thickness T1 of the seat 15 is larger than the protrusion T2 of the members protruding above the upper sides of memory slide 6 and change plate 16, such as guide pins 8 and 17. Therefore, there is provided a clearance between the pointer mount-plate 5 and links 3 and 4, and the memory slide 6 and change plate 16 located below them, so that the pointer mount-plate 5 will not be caught by other members below it when it is moved.

It should be noted, however, that in case the guide pins 8 and 17 supporting the memory slide 6 and change plate 16, respectively, are out of the moving range of the pointer mount-plate 5 and links 3 and 4, the protrusions of these guide pins 8 and pointer mount-plate 5 may be greater than the thickness of the seat 15 of the guide pins 3' and 4'. Also in this case, if there is any protrusion from the surface of the memory slide 6 or change plate 16, it is necessary that the thickness T1 of the seat 15 should be greater than the size T2 of such protrusion.

With the above-mentioned arrangement, the likelihood that the pointer mount-plate 5 and links 3 and 4 may be in contact with other members on the base plate of the pushbutton tuber while they are moving and be halted will be completely eliminated. As the result, an upper plate which has been indispensable in the prior art becomes unnecessary, and the thickness of the pusbutton tuner can be reduced correspondingly. Along with this omission of the upper plate, the necessary number of parts in the entire tuner can also be reduced and the support members provided on the base plate, such as the pivot pins, may be used in common as guide pins for other members. Thus, as compared with the conventional case where a pointer sliding mechanism used to be separately provided, the number of parts can be effectively reduced, due to the common use.

Figure 5:
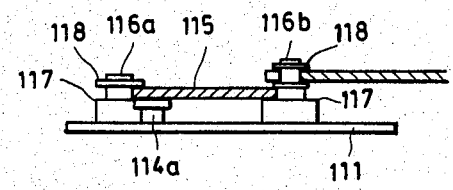
FIG. 5 is a sectional view of the mechanism shown in FIG. 4.

Referring now to FIGS. 4 and 5 illustrating another embodiment according to the present invention, a plurality of arms 113 of pushbuttons 112 are supported above the base plate 111 of the pushbutton tuner so as to be movable in the direction of the depth of the tuner. More particularly, the arms 113 are slidably fitted between arm guide pins 114a and 114b mounted in 2 rows, front and rear, on the base plate 111. Each of the arms 113 is disposed at the front end thereof between the arm guide pins 114a in the front row and at the rear end between the arm guide pins 114b in the rear row. The arm guide pins 114a and 114b have formed integrally therewith and at the tops thereof a flange; the arm 113 is limited against lateral movement by the side faces of the arm guide pins 114a and 114b, while it is restricted from up-down movement by the flanges atop the pins engaged on the upper lateral edges of the arm 113.

On the other hand, there is disposed a kick arm 115 above the arm 113 of the pushbutton 112 and perpendicular to the arm 113. The kick arm 115 has provided at the opposite ends thereof, respectively, a pair of slide guide pins 116a and 116b which are intended to limit the kick arm 115 against the movement in the direction of the depth of the tuner and also support the kick arm so as to be movable in the longitudinal direction thereof (in the direction of the width of the pushbutton tuner). The slide guide pins 116a and 116b are provided, as shown, with a step 117 to hold the kick arm 115 above the arm 113, and an E-ring 118 intended to prevent the kick arm 115 from disengaging from the tops of the slide guide pins 116a and 116b. The central portion of the kick arm is disposed above the arm guide pins 114a in the front row mounted on the base plate 111 and so designed that each of the arm guide pins 114a slidably touches the lower side of the kick arm to support the latter from below.

The kick arm 115 has provided thereon taper cams 119 for the pushbuttons 112 which, as shown with imaginary lines in FIG. 4, when a pushbutton 112 is pressed, can be engaged by a protrusion 120 provided on the pushbutton so that the kick arm 115 is moved in the direction of the width of the pushbutton tuner.

As having been described in the foregoing, the kick arm 115 is held by the slide guide pins 116a and 116b provided at the opposite ends thereof and is limited against movement in the direction of the depth of the tuner. Consequently, there is no necessity of forming any guide holes in the kick arm as in the prior art, in which the guide pins are inserted. Thus, it is possible to considerably reduce the width of the kick arm 115. This leads to a reduced space area occupied by the kick arm 115, thus permitting reduction of the depth of the pushbutton tuner. The kick arm 115 is supported at center thereof by the tops of the arm guide pins 114a, so that any wobble of the kick arm in the direction of the depth of the tuner is completely eliminated and also the kick arm can be smoothly moved. In the prior art, since the kick arm 115 is forced to move by the arm 113, the kick arm would have to be sufficiently thick and rigid not to be deformed by the pressure of the arm 113; however, according to the present invention, the arm guide pin 114a is provided in a position where the kick arm 115 is in contact with the arm 113, in order to support the kick arm 115, thereby eliminating the necessity of receiving the whole load from the arm 113 by the kick arm 115; the kick arm 115 can be designed to be thin.

Figure 7:
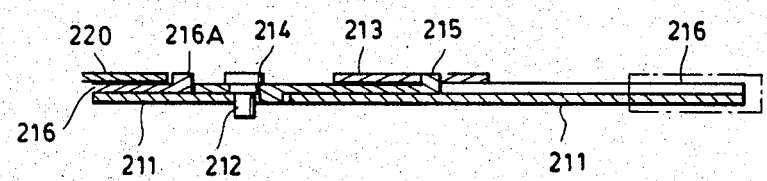
FIG. 7 is an sectional side view of the mechanism shown in FIG. 6.
Figure 8:
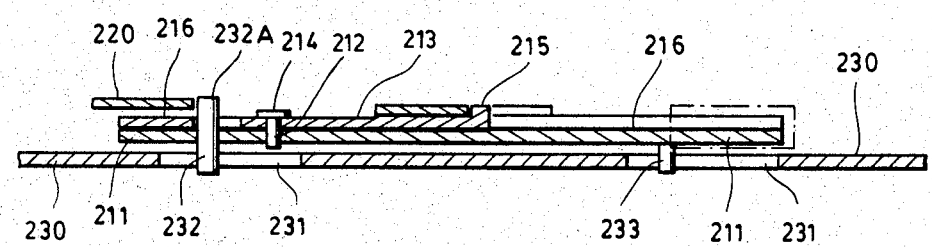
FIG. 8 is also a sectional side view of a variation of the mechanism illustrated in FIG. 6.
Figure 6:
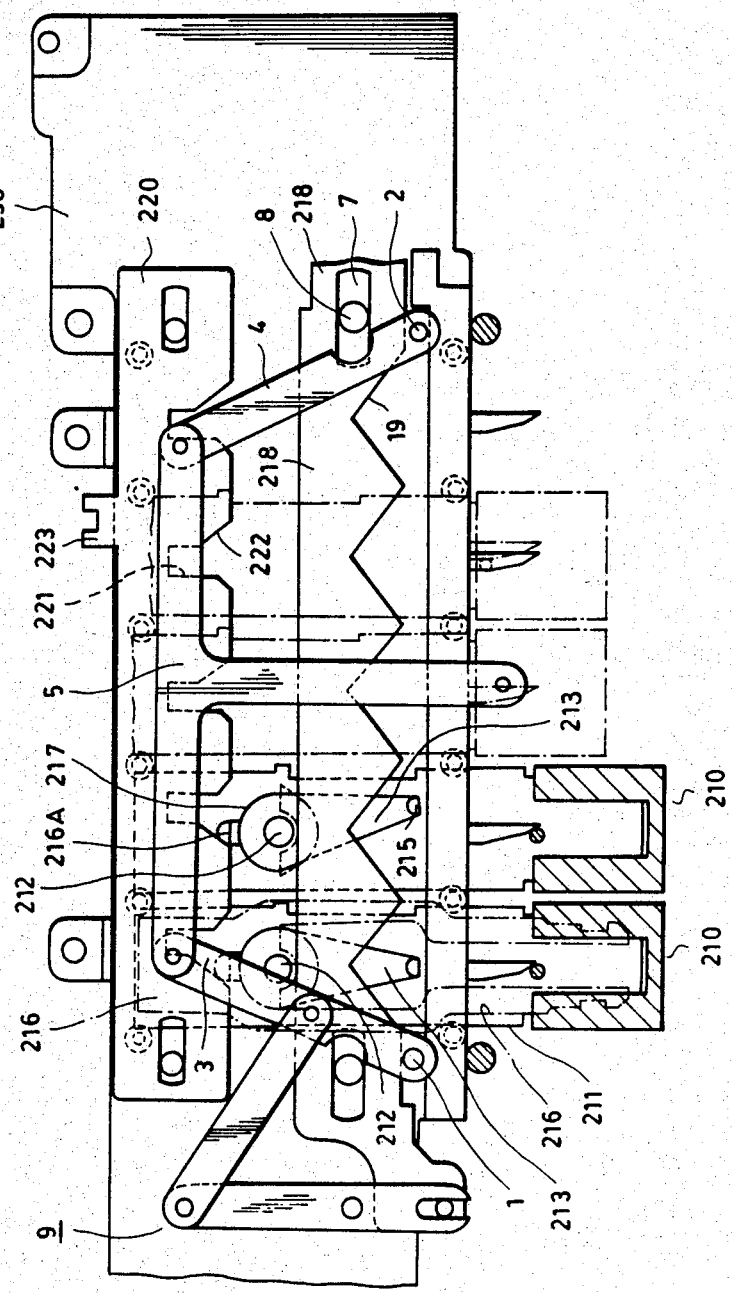
FIG. 6 is a plan view of a further embodiment according to the present invention showing a waveband selection mechanism.

Referring here to FIGS. 6 thru 8, illustrating a further embodiment of the present invention, there is provided on and projecting from the arm 211 of each pushbutton 210 a setting pin 212 on which a setting plate 213 is pivotably mounted. Atop the setting pin 212 is provided a flange 214 projecting above the setting plate 213, which blocks the setting plate 213 against disengagment from the setting pin 212. This setting plate 213 has a general shape of a tear drop, with the rear end thereof being circular while the front end (on the side of the pushbutton 210) is of a triangular shape and is provided with a protrusion 215 extending upward and intended for moving the memory slide.

There is provided on the upper side of the arm 211 a generally U-shaped plate spring 216 which surrounds the setting plate 213. The plate spring 216 is fixed at the rear end thereof to the arm 211, while the front ends of the spring 216 extend in the direction of the front end of the arm 211 and terminate as fitted in the pushbutton 210. There is formed at the rear end of the plate spring 216 an arched fastener 217 which is pressed around the setting plate 213. Further, the plate spring has provided at the upper side of the rear end thereof a convex portion 216A for selection of a waveband.

There is provided above the setting plate 213, namely, between the setting pins 212 and protrusions 215 a memory slide 218 so as to be perpendicular to each arm 211. This memory slide 218 is supported movably in the direction of the width of the pushbutton tuner frame and has, formed along the front edge, that is to say on the edge on the side of the pushbutton 210, V-shaped notches 219 opposite to the protrusions 215.

The memory slide 218 is coupled at one end thereof with a core slide supported for movement in the direction of the depth of the pushbutton tuner, and a core provided on the core slide is inserted in a tuning coil fixed on the base plate.

There is provided above the rear ends of the arms 211 a change plate 220 in parallel with the memory slide 218, which is movable in the direction of the width of the pushbutton tuner. The change plate 220 has formed along the front edge thereof notches 221 opposite to the waveband-selection convex portions 216A of the plate spring 216 provided around the arms 211. The openings of the notches 221 are tapered at 222. In this case, the tapered portions 222 of the notches 221 vary in location depending on the waveband to be selected by the pushbutton 210; in the illustrated embodiment, the opening of the notch is tapered at the left side thereof (at 222) for each pushbutton for selection of an AM band, while for each pushbutton for selection of an FM band, the opening of the notch is tapered at the right side. In addition, the change plate 220 has provided thereon a selection protrusion 223 coupled with a waveband selector switch (not shown) fixed on the base plate of the pushbutton tuner.

The waveband selection mechanism according to this embodiment of the present invention is designed as having been described in the foregoing, and functions as follows:

When a pushbutton is selected and pressed in the mode of pushbutton tuning, the protrusion 215 of the setting plate 213 fixed on the arm 211 of the pusbutton engages a V-shaped notch 219 of the memory slide 218, and moves along the inclined surfaces of the notch to move the memory slide 218 in the direction of the width of the tuner. The memory slide 218 is stopped when the protrusion 215 reaches the apex of the V-shaped notch 219. Depending upon this stopped position of the memory slide 218, the stop position within the tuning coil of the tuning core interlocked with the memory slide by means of the links and core slide is determined, thus a desired frequency is selected.

More particularly, when the arm 211 is pushed in by pressing the pushbutton 210, the waveband-selection convex portion 216A provided on and projecting from the surface of the plate spring 216 enters the notch 221 of the change plate 220 at the same time. At this time, the convex portion gets in contact with the tapered portion of the notch 221 and moves along the tapered portion to move the change plate 220 in the direction of the width of the pushbutton tuner. As the result, the waveband selector switch connected with the selection protrusion 223 on the change plate 220 is actuated to effect a switching to a waveband corresponding to the pushbutton. In order to switch the waveband of the tuner from one to another, another pushbutton 210 is pressed to force another notch 221 of the change plate 220 by means of the waveband-selection convex portion 216A on the plate spring 216 provided on the arm. In this embodiment, since there is formed a tapered portion 222 at the opening of the notch 221 on the side opposite to the above-mentioned notch 221, the convex portion 216A on the setting pin 212 gets in contact with this opposite-side tapered portion 222 to move the change plate 220 in the opposite direction.

As mentioned above, the present embodiment is characterized in that a waveband-selection convex portion is provided to let the tuning section provided on the arm move the change plate, but the location of the waveband-selection convex portion is not limited to being on the plate spring. As shown in FIG. 8, for example, the top end of the guide pin fixed on the arm may be projected upward at 232A to form the waveband-selection convex portion. That is to say, the base plate 230 of the tuner has formed therein guide holes 231 elongated longitudinally corresponding to the position of the arm of each pushbutton and in which front and rear guide pins 232 and 233 provided on the lower side of the arm are slidably inserted; these guide holes 231 and guide pins 232 and 233 thus guide the arm 211 for movement over the base plate in the direction of the depth of the pushbutton tuner. In this embodiment, the top end 232A of that guide pin 232 among the guide pins 232 and 233 which is located on the tuning section of the arm (corresponding to the plate spring 216 on the arm) is projected upwardly from the surface of the arm 211; this projection is used as a waveband-selection convex portion 232A which forces the change plate 220 to move.

As having been described in the foregoing, the present embodiment of the waveband selection mechanism utilizes as the member to move the change plate 220 the waveband-selection convex portion provided on the arm 211 or plate spring 216; since this convex portion is provided in the tuning section of the arm 211, the total length of the arm 211 is much shorter than that in a conventional tuner consisting of a separate waveband selector and tuning sections; also the depth of the pushbutton tuner can be reduced. Furthermore, since this embodiment has the waveband-selection convex portion with respect to the member located in the tuning section of the arm, it is not necessary to provide a member for exclusive use in moving the change plate as in the prior art. Thus, the number of the parts composing the arm can be reduced correspondingly.

The embodiments of the invention in which an exclusive property or privilege is claimed are defined as follows:

1. A pushbutton tuner having a pointer control mechanism which comprises:
    first and second pivots provided on a base plate of said pushbutton tuner;
    a pair of links which each have a first end pivotally supported on a respective one of said pivots;
    a pointer support plate which is pivotally coupled to a second end of each said link remote from said first end thereof;
    a memory slide movably supported on said base plate; and
    two link members which operatively couple said memory slide to one of said links, said link members having first ends which are operatively coupled to each other so that said link members form a V-shaped arrangement, one of said link members being pivotally supported on a third pivot provided on said base plate and being operatively coupled to said memory slide, and the other of said link members being pivotally coupled to one of said links at a location between said first and second ends of such link, wherein movement of said memory slide in a first direction causes said link members to move said pointer support plate in a second direction opposite to said first direction.

2. The pushbutton tuner according to claim 1, including a pin which pivotally couples one of said links to said pointer support plate, and a seat which is located below said pin and slidably engages a surface on a further member supported on said base plate of said pushbutton tuner so as to provide clearance between said further member and said pointer support plate and said links.

3. The pushbutton tuner according to claim 1, including:
    a plurality of arms supported on said base plate of said pushbutton tuner for movement in a direction approximately normal to the direction of movement of said memory slide;
    arm guide pins which guide movement of said arms;
    a kick arm supported for movement in a direction approximately perpendicular to the direction of movement of said arms and approximately parallel to the direction of movement of said memory slide; and
    slide guide pins cooperable with opposite ends of said kick arm so as to limit movement of said kick arm in directions parallel to the direction of movement of said arms;
    wherein said arm guide pins slidably engage a lower side of said kick arm to limit vertical movement of said kick arm.

4. The pushbutton tuner according to claim 1, including:
    a plurality of arms supported on said base plate of said pushbutton tuner for movement in a direction approximately normal to the direction of movement of said memory slide;
    a change plate supported for movement in a direction perpendicular to the direction of movement of said arms;
    a setting pin provided on each of said arms;
    a setting plate pivotably supported on each said setting pin;
    a plate spring provided on each said arm to releasably fix said setting plate thereon against pivotal movement;
    a waveband-selection convex portion on said plate spring; and
    plural notches formed in said change plate, each said notch being in alignment with a respective said waveband-selection convex portion;
    wherein each said waveband-selection convex portion can slidably engage a tapered portion formed in a respective said notch so as to effect movement of said change plate.

5. The pushbutton tuner according to claim 1, including:
    a plurality of arms supported on said base plate of said pushbutton tuner for movement in a direction approximately normal to the direction of movement of said memory slide;
    a change plate supported for movement in a direction perpendicular to the direction of movement of said arms;
    a setting pin provided on each of said arms;
    a setting plate pivotably supported on each said setting pin;
    a plate spring provided on each said arm to releasably fix said setting plate thereon against pivotal movement;
    a waveband-selection convex portion provided on a portion of said arm corresponding to said plate spring; and
    plural notches formed in said change plate, each said notch being aligned with a respective said waveband-selection convex portion;
    wherein each said waveband-selection convex portion can slidably engage a tapered portion formed in a respective said notch so as to effect movement of said change plate.

6. The pushbutton tuner according to claim 1;
wherein said first ends of said links are pivotally coupled to each other for movement about an axis substantially parallel to said first and second pivots,
wherein said link members form an acute angle with respect to each other in each operational position thereof; and
wherein said third pivot is substantially parallel to said first and second pivots.

7. The pushbutton tuner according to claim 6;
wherein said memory slide has a pin thereon; and
wherein one of said link members has in an end thereof remote from said first end a slot in which said pin of said memory slide is movably received.

8. The pushbutton tuner according to claim 7;
wherein the distance between said first and second pivots is greater than the distance between the locations at which said links are respectively pivotally coupled to said pointer support plate.

9. The pushbutton tuner according to claim 8;
wherein said pointer support plate is generally T-shaped and has a cross member and a stem, each said link being pivotally coupled to a respective end of said cross member of said pointer support plate; and
including a pointer provided at an end of said stem remote from said cross member.

* * * * *